US008317450B2

(12) United States Patent
Dawson et al.

(10) Patent No.: US 8,317,450 B2
(45) Date of Patent: Nov. 27, 2012

(54) TACTILE WAFER LIFTER AND METHODS FOR OPERATING THE SAME

(75) Inventors: Keith E. Dawson, Livermore, CA (US); Dave Evans, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 1048 days.

(21) Appl. No.: 12/261,775

(22) Filed: Oct. 30, 2008

(65) Prior Publication Data

US 2010/0111651 A1 May 6, 2010

(51) Int. Cl.
*B65H 1/00* (2006.01)
(52) U.S. Cl. .................. 414/226.05; 200/47
(58) Field of Classification Search .......... 901/13; 200/47; 118/500; 269/317, 319; 414/226.05
See application file for complete search history.

(56) References Cited

U.S. PATENT DOCUMENTS

| | | | | |
|---|---|---|---|---|
| 3,119,009 A * | 1/1964 | Zeller | .................. | 219/125.1 |
| 3,819,061 A * | 6/1974 | Andersson et al. | ............ | 414/591 |
| 4,785,240 A * | 11/1988 | Newell et al. | ............ | 324/207.26 |
| 4,928,066 A * | 5/1990 | Adlon et al. | ................ | 324/539 |
| 5,034,729 A * | 7/1991 | Lundquist | .................. | 340/683 |
| 5,207,316 A * | 5/1993 | Sakamoto | .................. | 200/47 |
| 5,430,264 A * | 7/1995 | Shinohara et al. | ............ | 200/47 |
| 5,683,547 A * | 11/1997 | Azuma et al. | .................. | 438/695 |
| 6,221,781 B1 * | 4/2001 | Siefering et al. | ............ | 438/704 |
| 6,321,611 B1 * | 11/2001 | Szu et al. | .................. | 74/89.37 |
| 6,481,723 B1 * | 11/2002 | Hao et al. | .................. | 279/128 |
| 6,578,853 B1 * | 6/2003 | Treur et al. | .................. | 279/121 |
| 6,612,014 B1 * | 9/2003 | Donoso et al. | .................. | 29/559 |
| 6,779,278 B1 * | 8/2004 | Spady et al. | .................. | 33/569 |
| 6,972,071 B1 * | 12/2005 | Tyler | .................. | 156/345.47 |
| 7,032,287 B1 * | 4/2006 | Spady et al. | .................. | 29/559 |
| 7,087,122 B2 * | 8/2006 | Smith et al. | .................. | 134/33 |
| 7,271,356 B2 * | 9/2007 | Truett | .................. | 200/47 |
| 7,525,057 B2 * | 4/2009 | Glasson | .................. | 200/329 |
| 7,557,315 B2 * | 7/2009 | Chen | .................. | 200/47 |
| 7,731,469 B2 * | 6/2010 | Narita et al. | ............ | 414/222.01 |
| 7,782,591 B2 * | 8/2010 | Cho et al. | .................. | 361/226 |
| 7,815,558 B2 * | 10/2010 | Tajiri et al. | .................. | 483/4 |
| 7,862,693 B2 * | 1/2011 | Dordi et al. | ............ | 204/228.1 |
| 7,871,470 B2 * | 1/2011 | Schieve et al. | .................. | 118/728 |
| 8,043,200 B2 * | 10/2011 | Tajiri et al. | .................. | 483/1 |
| 2004/0266222 A1 * | 12/2004 | Sata | .................. | 438/795 |
| 2008/0242105 A1 * | 10/2008 | Kai et al. | .................. | 438/758 |
| 2009/0053029 A1 * | 2/2009 | Yoshino et al. | ............ | 414/783 |
| 2009/0200269 A1 * | 8/2009 | Kadkhodayan et al. | ......... | 216/71 |
| 2010/0166957 A1 * | 7/2010 | Sneh | .................. | 427/255.28 |
| 2011/0277784 A1 * | 11/2011 | Dhindsa | .................. | 134/1.1 |
| 2011/0281435 A1 * | 11/2011 | Sadjadi et al. | ............ | 438/703 |

FOREIGN PATENT DOCUMENTS

| | | |
|---|---|---|
| JP | 2001-044265 | 2/2001 |
| JP | 2002-237464 | 8/2002 |
| JP | 2003-218186 | 7/2003 |
| JP | 2008-028084 | 2/2008 |

* cited by examiner

*Primary Examiner* — Joshua Rudawitz
(74) *Attorney, Agent, or Firm* — Martine Penilla Group, LLP

(57) ABSTRACT

A tactile wafer lifting apparatus includes a pedestal and a vertical drive connected to the pedestal. The vertical drive is defined to provide controlled upward and downward movement of the pedestal. The tactile wafer lifting apparatus also includes a wafer support member disposed over the pedestal. A tactile switch is disposed between the wafer support member and the pedestal such that sufficient downward force on the wafer support member causes activation of the tactile switch. The tactile switch is connected to the vertical drive so as to interrupt upward movement of the pedestal and wafer support member disposed thereover upon activation of the tactile switch.

18 Claims, 13 Drawing Sheets

TACTILE WAFER LIFTER AND METHODS FOR OPERATING THE SAME

BACKGROUND

In the fabrication of semiconductor devices such as integrated circuits, memory cells, and the like, a series of manufacturing operations are performed to define features on semiconductor wafers ("wafers" or "substrates"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The various wafer manufacturing operations require handling and movement of the wafer. For instance, some manufacturing operations require vertical movement of the wafer at a given location, and employ a lifting device to provide this vertical movement of the wafer. A basic wafer lifting device may be defined to simply move a wafer from one vertical level to another vertical level, without regard to potential interference or collision along the vertical path of travel. In some wafer manufacturing systems, there could be other moving components that may enter the vertical path of travel of the wafer lifting device, thereby creating a potential for interference or collision along the wafer lifting path. It should be appreciated that such an interference or collision could result in breakage of the wafer lifting device, the component involved in the collision, and/or the wafer itself, if present on the wafer lifting device or component at the time of the collision. As expected, such breakages can be extremely costly in terms of product loss and system downtime.

SUMMARY

In one embodiment, a tactile wafer lifting apparatus is disclosed. The tactile wafer lifting apparatus includes a pedestal and a vertical drive connected to the pedestal. The vertical drive is defined to provide controlled upward and downward movement of the pedestal. The tactile wafer lifting apparatus also includes a wafer support member disposed over the pedestal. A tactile switch is disposed between the wafer support member and the pedestal such that sufficient downward force on the wafer support member causes activation of the tactile switch. The tactile switch is connected to the vertical drive so as to interrupt upward movement of the pedestal and wafer support member disposed thereover upon activation of the tactile switch.

In another embodiment, a wafer handling system is disclosed. The wafer handling system includes a wafer carrier defined to move horizontally within a processing chamber. The wafer carrier includes an open region having a number of wafer support tabs disposed about a periphery of the open region. The open region of the wafer carrier is sized to accommodate a wafer when positioned on the wafer support tabs. The wafer handling system also includes a tactile wafer lifter disposed in a fixed position within the chamber below a horizontal traversal path of the wafer carrier. The tactile wafer lifter includes a pedestal and a wafer support member disposed over the pedestal. The tactile wafer lifter also includes a vertical drive connected to the pedestal. The vertical drive is defined to provide controlled upward and downward movement of the pedestal and wafer support member disposed thereover, such that the pedestal and wafer support member are moveable through the open region of the wafer carrier when the wafer carrier is positioned above the tactile wafer lifter. The tactile wafer lifter further includes a tactile switch disposed between the wafer support member and the pedestal, such that sufficient downward force on the wafer support member causes activation of the tactile switch. The tactile switch is connected to the vertical drive so as to interrupt upward movement of the pedestal and wafer support member disposed thereover upon activation of the tactile switch.

In another embodiment, a method is disclosed for operating a tactile wafer lifting apparatus. The method includes lifting a wafer support member of the tactile wafer lifting apparatus. The method also includes activating a tactile switch in response to application of a sufficient downward force on the wafer support member. In response to activating the tactile switch, the lifting of the wafer support member is automatically interrupted, and the wafer support member is lowered to a bottom position.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
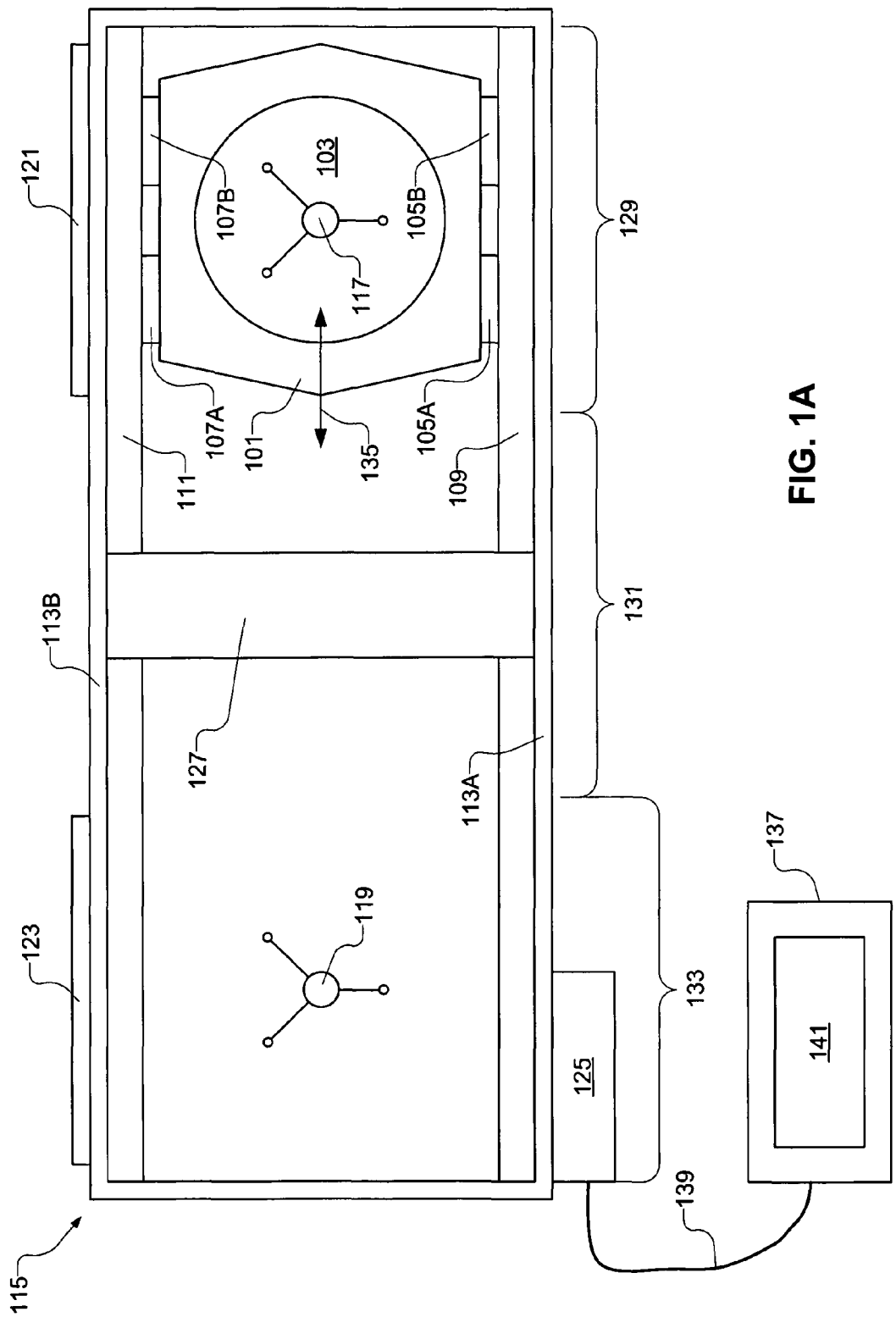
FIG. 1A is an illustration showing a wafer wet processing chamber that incorporates a wafer handling system as described herein, in accordance with one embodiment of the present invention.

FIG. 1A is an illustration showing a wafer wet processing chamber 115 that incorporates a wafer handling system as described herein, in accordance with one embodiment of the present invention. The chamber 115 is defined by exterior walls that include the substantially parallel side walls 113A and 113B. A drive rail 109 is attached to the side wall 113A in a substantially level orientation. A guide rail 111 is attached to the side wall 113B in a substantially level orientation. A wafer carrier 101 is disposed in a substantially level orientation so as to extend between the drive rail 109 and the guide rail 111. A pair of drive trucks 105A/105B are affixed to the drive side of the wafer carrier 101, and are positioned to contact the exterior drive surface of the drive rail 109. A pair of guide supports 107A/107B are affixed to the guide side of the wafer carrier 101, and are positioned to interface with a guide track of the guide rail 111. Handle magnets within the drive trucks 105A/105B are magnetically coupled to respective drive magnets within an interior cavity of the drive rail 109. Therefore, linear movement of the drive magnets within the drive rail 109 will cause a corresponding linear movement of the wafer carrier 101 along the drive rail 109, as indicated by arrow 135. Therefore, the wafer carrier 101 is defined to move horizontally within the processing chamber 115.

A motor 125 is mechanically coupled to a drive mechanism within the interior cavity of the drive rail 109 to provide for controlled movement of the drive magnets within the interior cavity of the drive rail 109, along the length of the drive rail 109. The motor 125 is connected to a computer system 137 by way of a control link 139. The computer system 137 is defined to control the motor 125. In one embodiment, the computer system 137 operates a GUI 141 defined to provide for manual specification of the velocity profile to be applied by the motor 125 to the drive magnets within the interior cavity of the drive rail 109. As previously mentioned, the velocity profile specifies a velocity of the drive magnets at each location along the length of the drive rail 109.

The chamber 115 includes an input module 129, a processing module 131, and an output module 133. The drive rail 109 and the guide rail 111 extend continuously through each of the input module 129, the processing module 131, and the output module 133. Therefore, the wafer carrier 101 can be moved linearly along the drive rail 109 and guide rail 111 through each of the input module 129, the processing module 131, and the output module 133. The input module 129 includes a door assembly 121 through which a wafer can be inserted into the chamber 115 by a wafer handling device. The input module also includes a wafer lifter 117 defined to move vertically through an open region 103 of the wafer carrier 101, when the wafer carrier 101 is centered thereover in the input module 129. The wafer lifter 117 can be raised to receive a wafer when inserted into the chamber 115 through the door assembly 121. The wafer lifter 117 can then be lowered to place the wafer on the wafer carrier 101 and clear the travel path of the wafer carrier 101.

The processing module 131 includes a processing head 127 disposed to interface with a wafer to be carried by the wafer carrier 101. In one embodiment, the processing head 127 is mounted to both the drive rail 109 and the guide rail 111, such that a vertical position of the processing head 127 is indexed to both a vertical position of the drive rail 109 and a vertical position of the guide rail 111. The processing head 127 is defined to expose the wafer present on the wafer carrier 101 to a processing solution. In some embodiments, the processing head 127 is defined to dispense a meniscus of processing solution onto the wafer surface as the wafer traverses beneath the processing head 127. The processing solution is formulated to react with the wafer surface to achieve a particular wafer processing result. In one embodiment, the processing head 127 is equipped to perform multiple wafer processing operations as the wafer is moved under the processing head 127 by the wafer carrier 101. For example, in one embodiment, the processing head 127 can be equipped to process the wafer surface, rinse the wafer surface, and dry the wafer surface, as the wafer traverses thereunder. Also, in another embodiment, multiple processing heads 127 can be mounted to the drive rail 109 and guide rail 111, such that the wafer carrier 101 moves the wafer under each of the multiple processing heads 127.

Once the wafer carrier 101 moves through the processing module 131, the wafer carrier 101 arrives at the output module 133. The output module 133 includes a wafer lifter 119 defined to move vertically through the open region 103 of the wafer carrier 101, when the wafer carrier 101 is centered thereover in the output module 133. The wafer lifter 119 can be raised to lift the wafer from the wafer carrier 101 to a position for retrieval from the chamber 115. The output module 133 also includes a door assembly 123 through which a wafer can be retrieved from the chamber 115 by a wafer handling device. Once the wafer is retrieved off of the wafer lifter 119, the wafer lifter 119 can be lowered to clear the travel path of the wafer carrier 101. Then, the wafer carrier 101 is moved back to the input module 129 to retrieve the next wafer for processing.

Figure 1B:
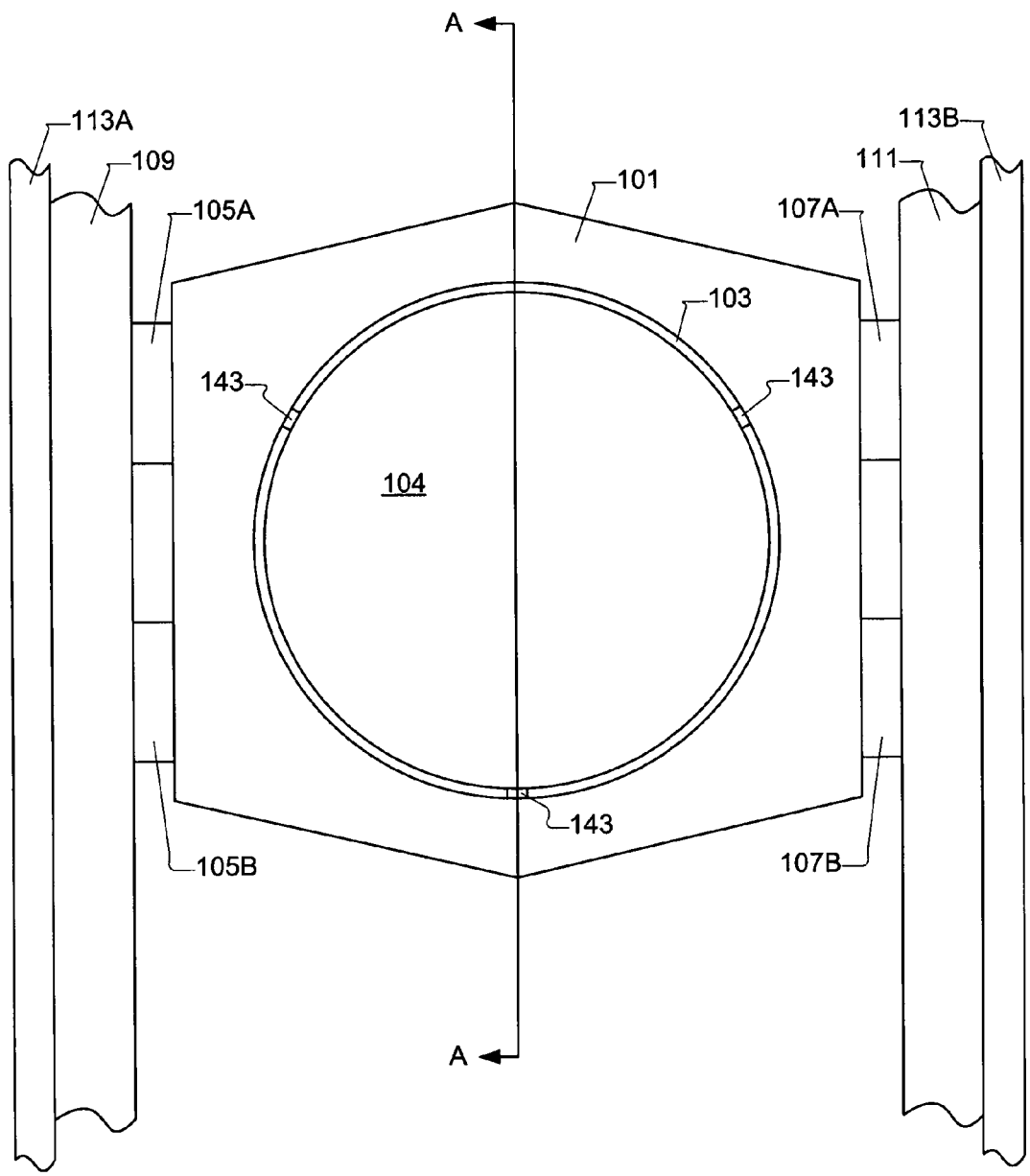
FIG. 1B is an illustration showing a top view of the wafer carrier with a wafer positioned thereon, in accordance with one embodiment of the present invention.

FIG. 1B is an illustration showing a top view of the wafer carrier 101 with a wafer 104 positioned thereon, in accordance with one embodiment of the present invention. The wafer carrier 101 is disposed to extend in a substantially horizontal direction from the drive rail 109 to the guide rail 111. The wafer carrier 101 includes the centrally located open region 103 having a number of wafer support tabs 143 disposed about a periphery of the open region 103. The open region 103 is sized to accommodate the wafer 104 when positioned on the wafer support tabs 143. FIG. 1B also identifies a cross-section view A-A as depicted in FIGS. 1C-1G.

Figure 1D:
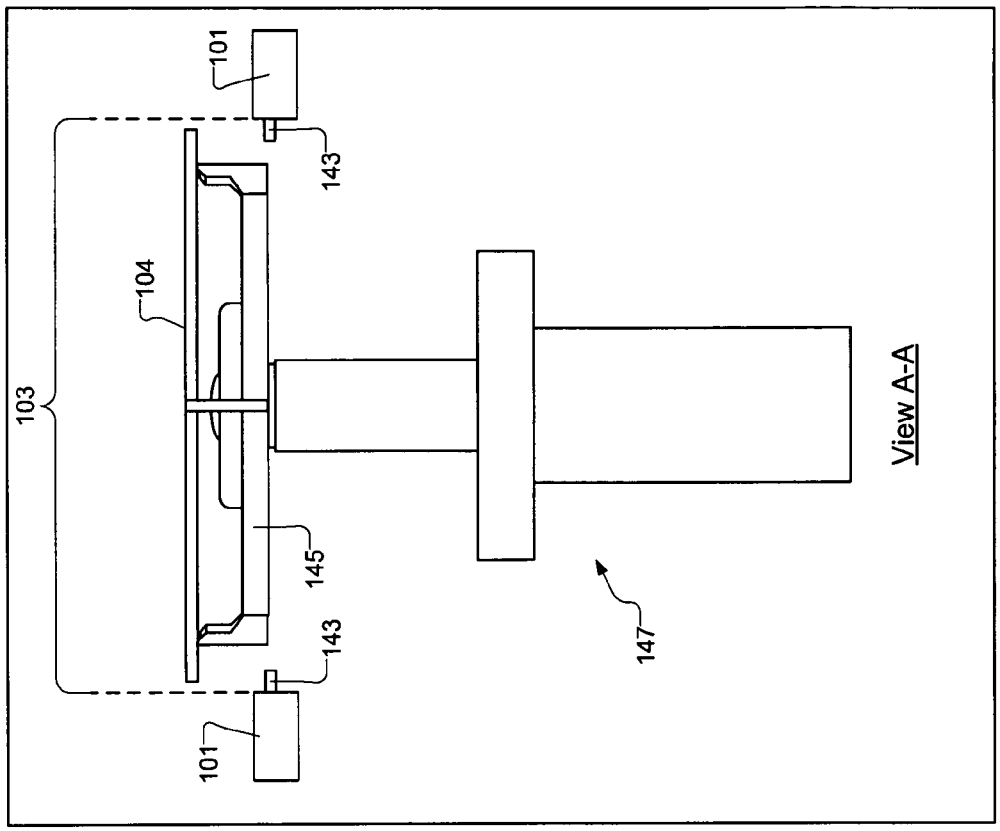
FIG. 1D illustrates that the wafer is placed on the wafer support member of the wafer lifter when the wafer support member is extended above the wafer carrier.
Figure 1C:
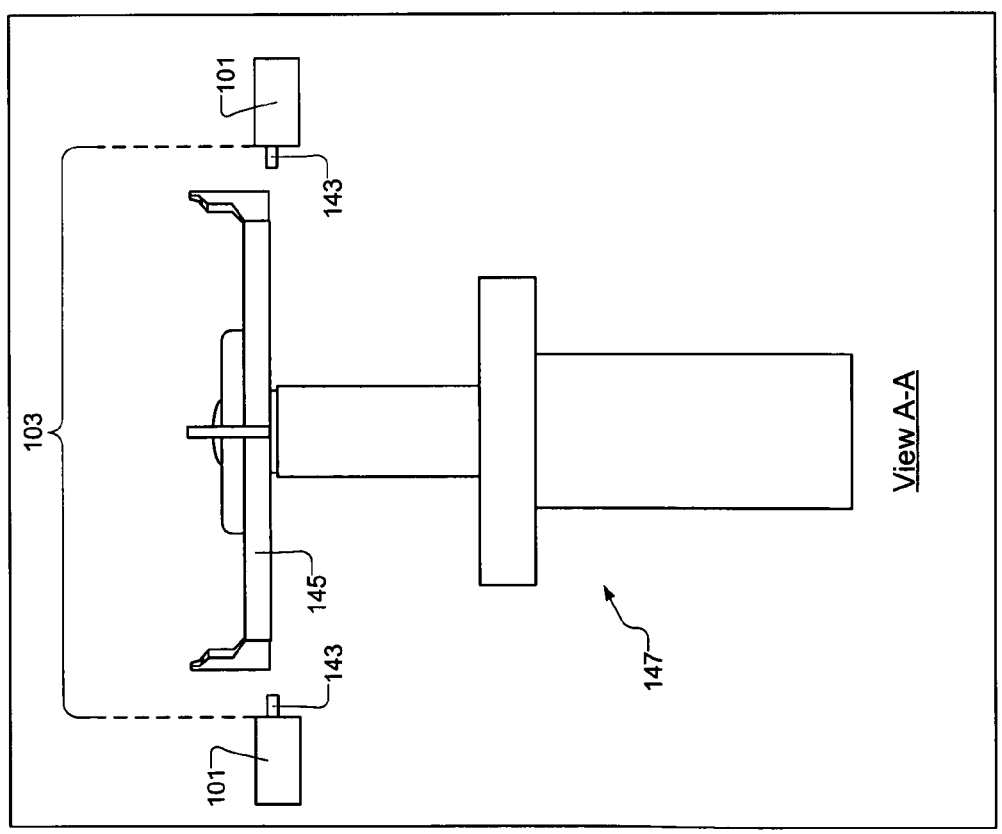
FIG. 1C illustrates that the wafer lifer is operated to extend a wafer support member through the open region of the wafer carrier, when the wafer carrier is positioned above the wafer lifter.
Figure 1E:
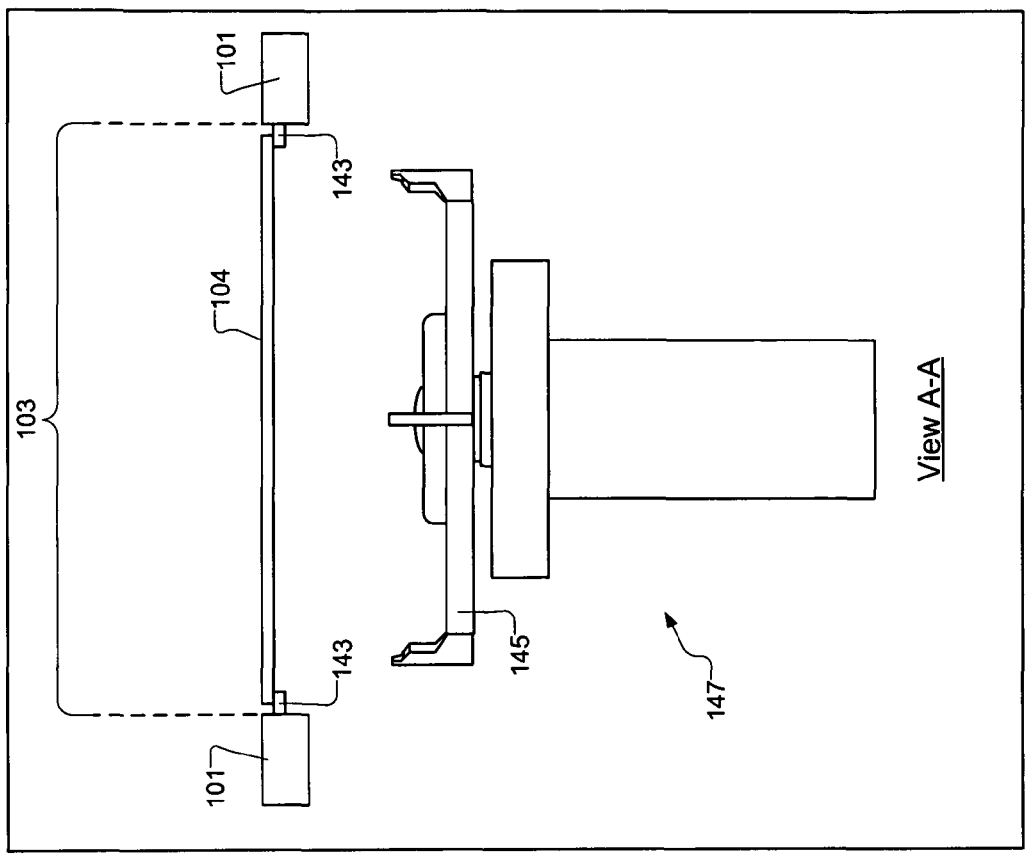
FIG. 1E illustrates that after receiving the wafer on the wafer support member, the wafer lifter is operated to lower the wafer support member such that the wafer comes to rest on the wafer support tabs of the wafer carrier.
Figure 1F:
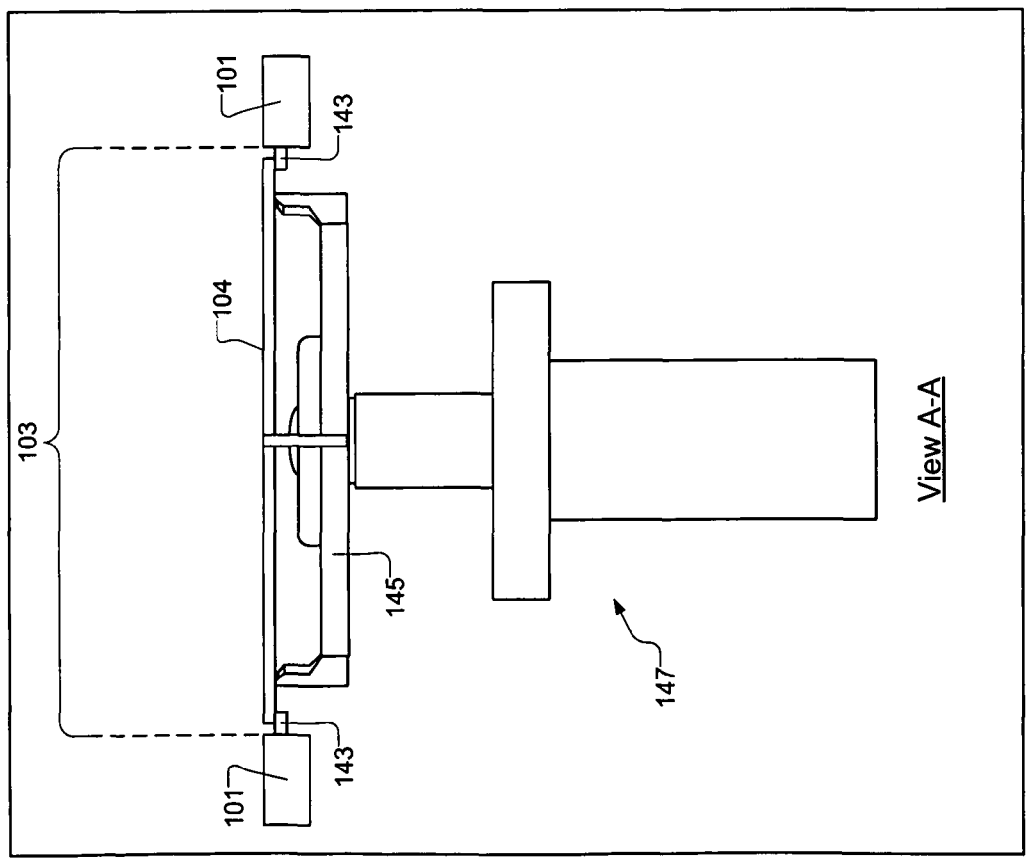
FIG. 1F illustrates that the wafer lifter lowers the wafer support member to a fully lowered position, i.e., home position, where the wafer support member resides as the wafer carrier horizontally transports the wafer during processing operations.

FIGS. 1C through 1F depict a series of operations performed by a wafer lifter 147, such as wafer lifters 117 and 119 described above. FIG. 1C illustrates that the wafer lifer 147 is operated to extend a wafer support member 145 through the open region 103 of the wafer carrier 101, when the wafer carrier 101 is positioned above the wafer lifter 147. FIG. 1D illustrates that the wafer 104 is placed on the wafer support member 145 of the wafer lifter 147 when the wafer support member is extended above the wafer carrier 101. FIG. 1E illustrates that after receiving the wafer 104 on the wafer support member 145, the wafer lifter 147 is operated to lower the wafer support member 145 such that the wafer 104 comes to rest on the wafer support tabs 143 of the wafer carrier 101. FIG. 1F illustrates that the wafer lifter 147 lowers the wafer support member 145 to a fully lowered position, i.e., home position, where the wafer support member resides as the wafer carrier 101 horizontally transports the wafer 104 during processing operations.

Figure 1G:
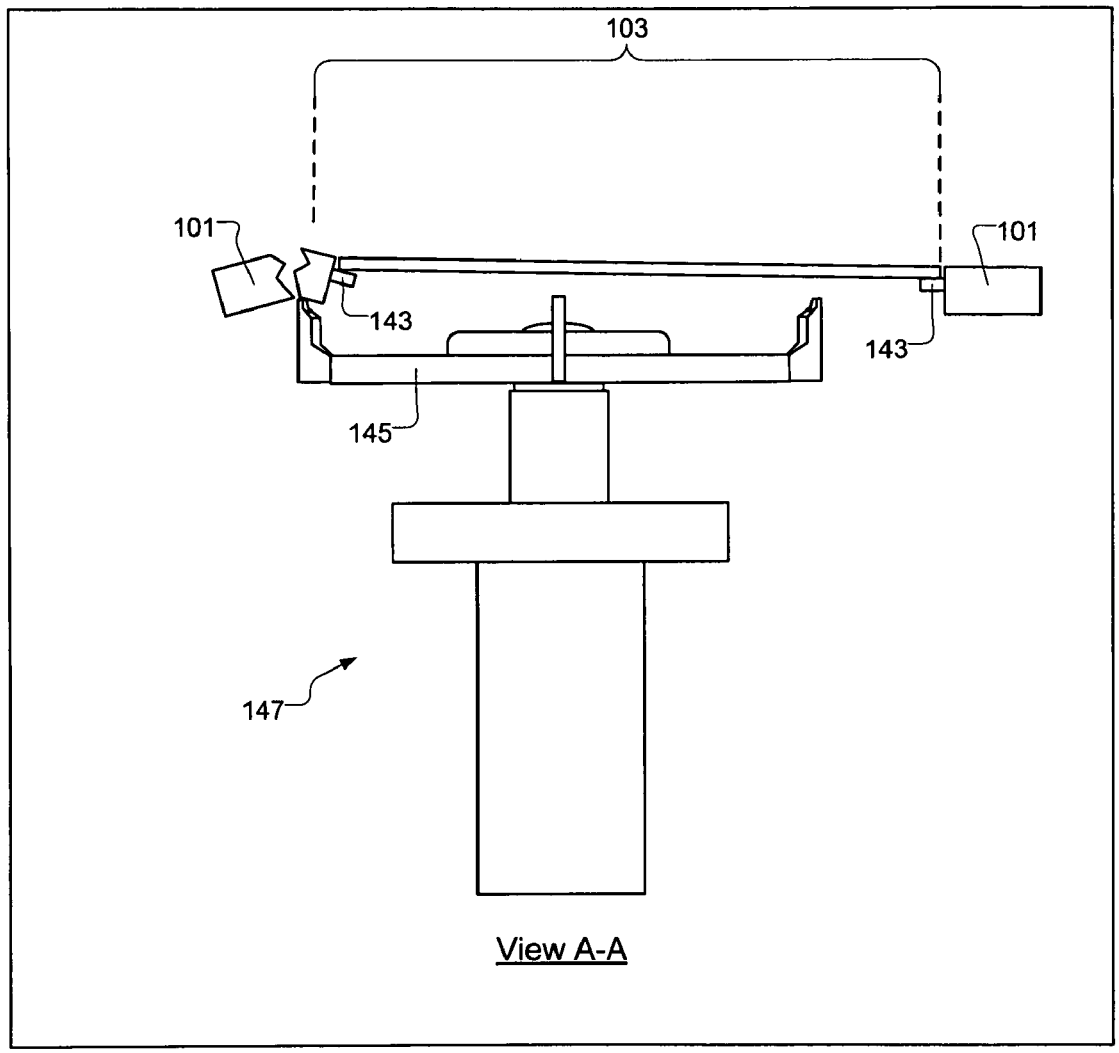
FIG. 1G illustrates a scenario in which the open region of the wafer carrier is misaligned with the wafer lifter, thereby resulting in a collision between the wafer support member and the wafer carrier during a lifting operation to remove the wafer from the wafer carrier.

To remove the wafer from the wafer carrier 101, the wafer lifter 147 is essentially operated through a reverse sequence of the operations of FIGS. 1C-1F. It should be appreciated that as the wafer support member 145 is lifted through the open region 103 of the wafer carrier 101, proper alignment of the open region 103 to the wafer lifter 147 is necessary to avoid a collision between the wafer support member 145 and the wafer carrier 101. For example, FIG. 1G illustrates a scenario in which the open region 103 of the wafer carrier 101 is misaligned with the wafer lifter 147, thereby resulting in a collision between the wafer support member 145 and the wafer carrier 101 during a lifting operation to remove the wafer 104 from the wafer carrier 101. It should be appreciated that such a collision between the wafer support member 145 and the wafer carrier 101 may result in breakage of the wafer carrier 101, the wafer support member 145, the wafer 104 itself, or any combination thereof, in addition to potentially damaging other components of the processing chamber 115.

For example, in one embodiment, the wafer carrier 101 is defined to ensure that a process gap is maintained between the wafer 104 and the processing head 127 as the wafer carrier 101 transports the wafer 104 beneath the processing head 127. In this embodiment, the wafer carrier 101 is defined to be both thin and stiff, and thus brittle and fragile. Consequently, an unmitigated collision between the wafer support member 145 and the wafer carrier 101 will almost certainly cause breakage of the wafer carrier 101, and wafer 104 if present thereon.

To mitigate the effects of such a collision between a wafer lifter and another component, such as between wafer lifters 117/119 and the wafer carrier 101, the present invention provides a tactile wafer lifter 200 that is defined to sense a collision and react to the collision so as to prevent breakage of the tactile wafer lifter 200 and components involved in the collision. The tactile wafer lifter 200 disclosed herein can be utilized for either or both of the wafer lifters 117 and 119 described with regard to the processing chamber 115 of FIGS. 1A-1G. Additionally, it should be understood that the tactile wafer lifter 200 disclosed herein can be used in essentially any other system in which it is necessary to vertically move, i.e., lift/lower, a wafer or substrate.

Figure 2A:
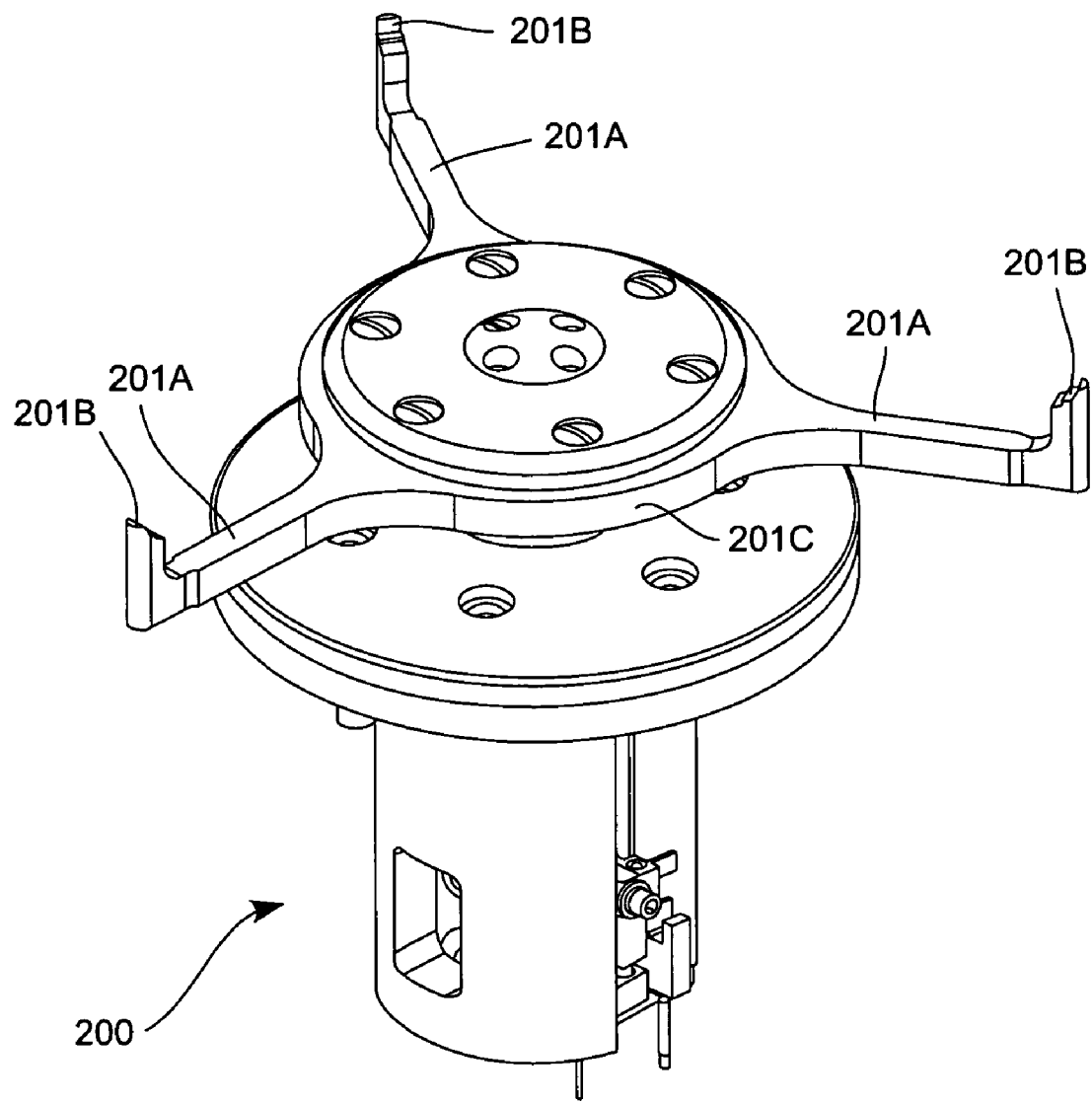
FIG. 2A is an illustration showing a tactile wafer lifting device, in accordance with one embodiment of the present invention.

FIG. 2A is an illustration showing a tactile wafer lifting device 200 ("tactile lifter" 200 hereafter), in accordance with one embodiment of the present invention. The tactile lifter 200 in defined to vertically raise and lower a wafer support member 201 in a controlled manner. Moreover, the tactile lifter 200 is defined to sense a collision between the wafer support member 201 and an interfering object during lifting of the wafer support member 201, and respond to the sensed collision in a manner that immediately and automatically stops vertical movement of the wafer support member 201. The immediate and automatic stopping of the vertical movement of the wafer support member 201 is performed in a manner so as avoid breakage of wafer support member 201, breakage of the other object involved in the collision, and/or breakage of the wafer if present on the wafer support member 201 at the time of the collision.

Figure 2B:
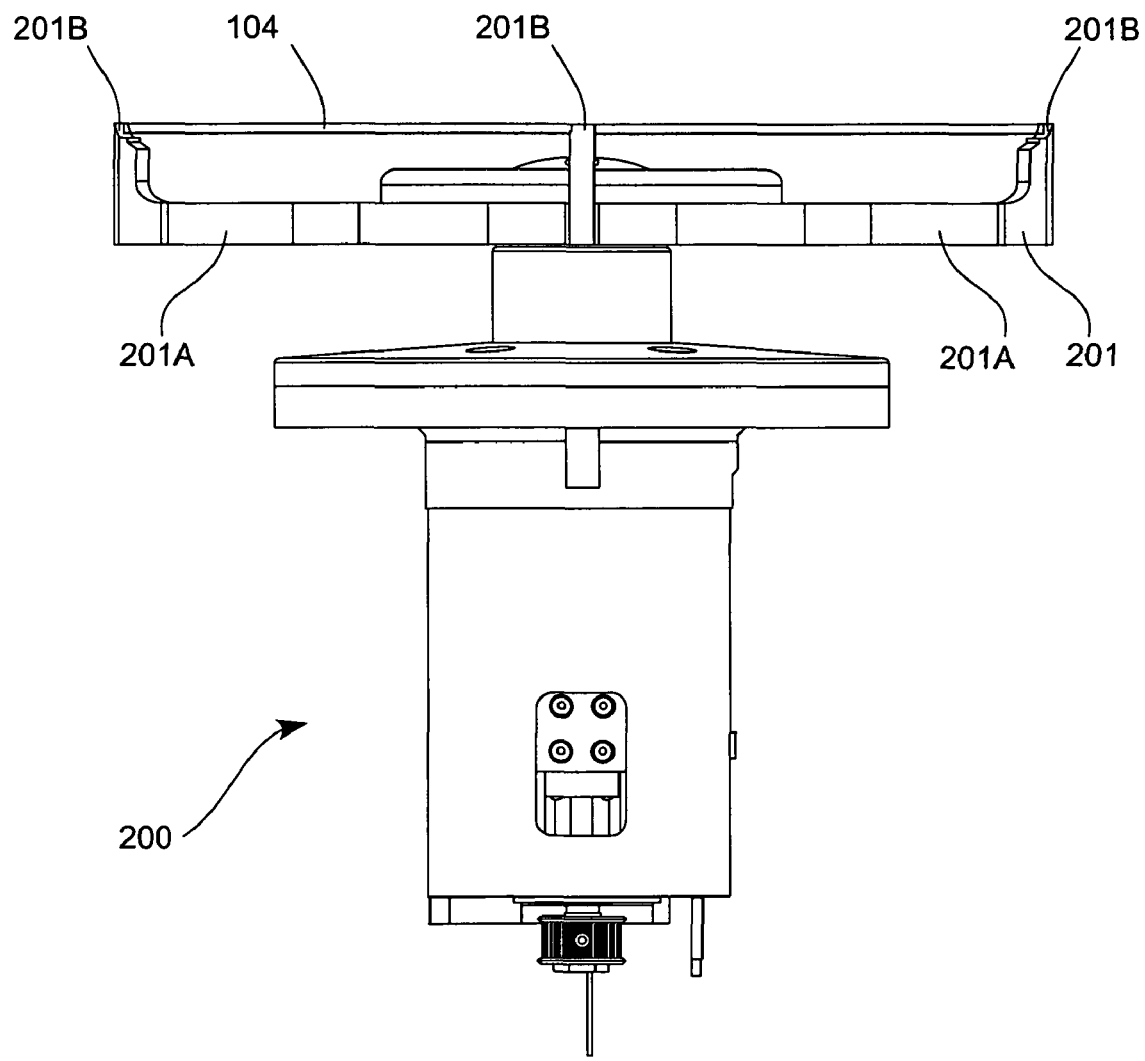
FIG. 2B is an illustration showing a side view of the tactile lifter of FIG. 2A, with the wafer disposed thereon, in accordance with one embodiment of the present invention.

The wafer support member 201 includes a number of arms 210A that extend radially outward from a central hub 201C. Each arm 201A is terminated by a respective wafer engagement member 201B defined to engage the wafer at a position above the central hub 201C and arms 201A. FIG. 2B is an illustration showing a side view of the tactile lifter 200 of FIG. 2A, with the wafer 104 disposed thereon, in accordance with one embodiment of the present invention. The particular embodiment of FIGS. 2A and 2B includes three arms 201A with respective wafer engagement members 201B. However, it should be understood that in other embodiments, the wafer support member 201 may include more than three arms 201A. Additionally, in other embodiments, the shape of the wafer support member 201 may vary from what is explicitly depicted herein, so long as the wafer support member 201 is capable of safely engaging and holding the wafer 104 at a position above the tactile lifter 200, such that vertical movement of the wafer support member 201 through operation of the tactile lifter 200 will result in corresponding vertical movement of the wafer 104 disposed thereon.

Figure 2C:
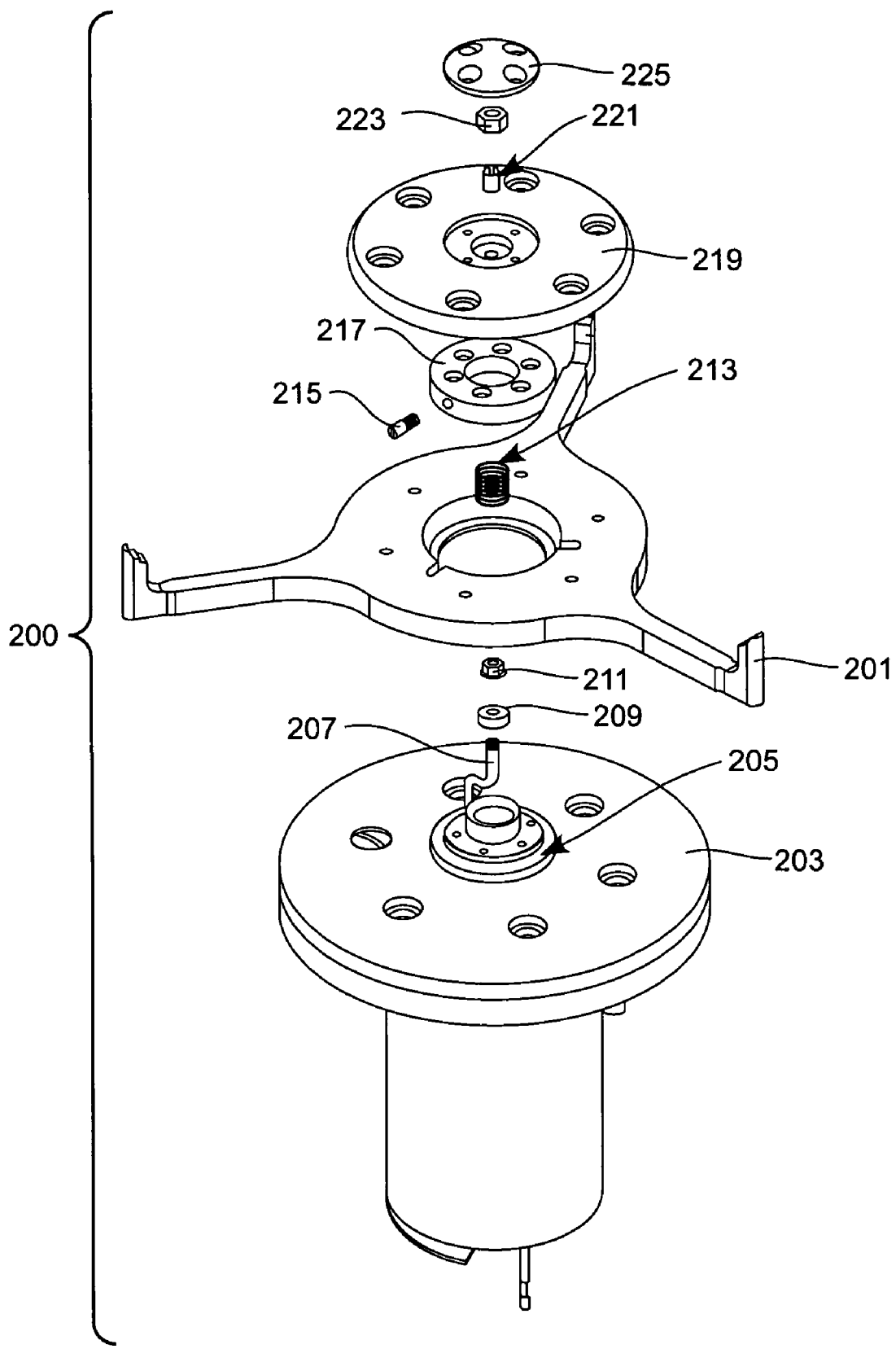
FIG. 2C is an illustration showing an exploded view of the tactile lifter, in accordance with one embodiment of the present invention.
Figure 2D:
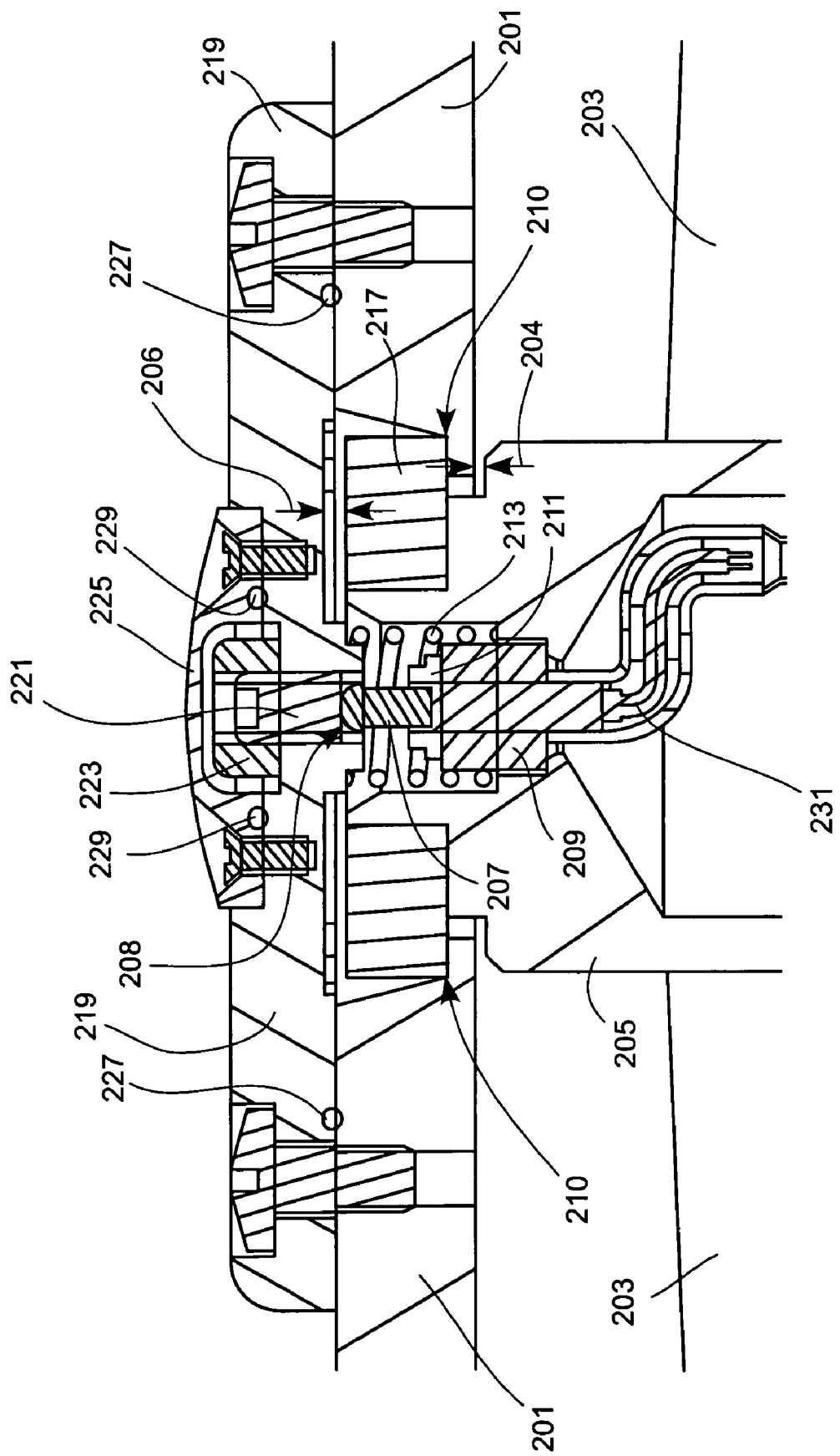
FIG. 2D is an illustration showing a close-up cross-sectional view of the tactile lifter in an assembled form, in accordance with one embodiment of the present invention.

FIG. 2C is an illustration showing an exploded view of the tactile lifter 200, in accordance with one embodiment of the present invention. FIG. 2D is an illustration showing a close-up cross-sectional view of the tactile lifter 200 in an assembled form, in accordance with one embodiment of the present invention. The following discussion is equally applicable to both FIGS. 2C and 2D. The tactile lifter 200 includes a base 203 secured in a substantially vertical orientation. A pedestal 205 is disposed within a vertical channel formed inside the base 203. In one embodiment, the pedestal 205 is defined to have an outer cylindrical body that extends through the vertical channel inside the base 203.

Generally speaking, the tactile lifter 200 is defined to move the pedestal 205 in a carefully controlled manner up and down the vertical channel of the base 203. To this end, the pedestal 205 is mechanically connected to a vertical drive system. In one embodiment, an electric motor is included within the vertical drive system to provide for controlled vertical movement of the pedestal 205. The vertical drive system may further include a drive means such as a lead screw, chain, belt, or track, along with associated mechanical components such as gears and sprockets, as necessary to transfer mechanical motion from the electric motor into vertical motion of the pedestal 205. Although the above-described vertical drive system embodiment utilizes an electric motor, it should be understood that other types of vertical drive systems can be implemented to provide controlled vertical movement to the pedestal 205. For example, in another embodiment, a pneumatic-based vertical drive system may be utilized.

The tactile wafer lifer 200 further includes the wafer support member 201 previously described with regard to FIGS. 2A-2B. The wafer support member 201 is disposed in a substantially centered manner over the pedestal 205. A lock plate 217 is secured to a top surface of the pedestal 205. The wafer support member 201 is allowed to move freely in a vertical direction with respect to the lock plate 217. Also, the wafer support member 201 is pushed upward within the tactile lifter 200 assembly by an elastically compliant member 213. The lock plate 217 is defined to provide a hard stop to upward movement of the wafer support member 201. The upward stop of the wafer support member 201 by the lock plate 217 occurs at an interface 210.

Additionally, the lock plate 217 is defined to azimuthally lock the wafer support member 201 relative to the pedestal 205. To enable this azimuthal locking, a lock pin 215 is secured within an outer side wall of the lock plate 217. In one embodiment, the lock pin 215 is secured to the lock plate 217 by a threaded connection. In another embodiment, the lock pin 215 is an integral part of the lock plate 217. The lock pin 215 is sized to fit within a channel 233 formed within a top surface of the hub 201C of the wafer support member 201, at a location proximate to the lock plate 217.

Figure 2E:
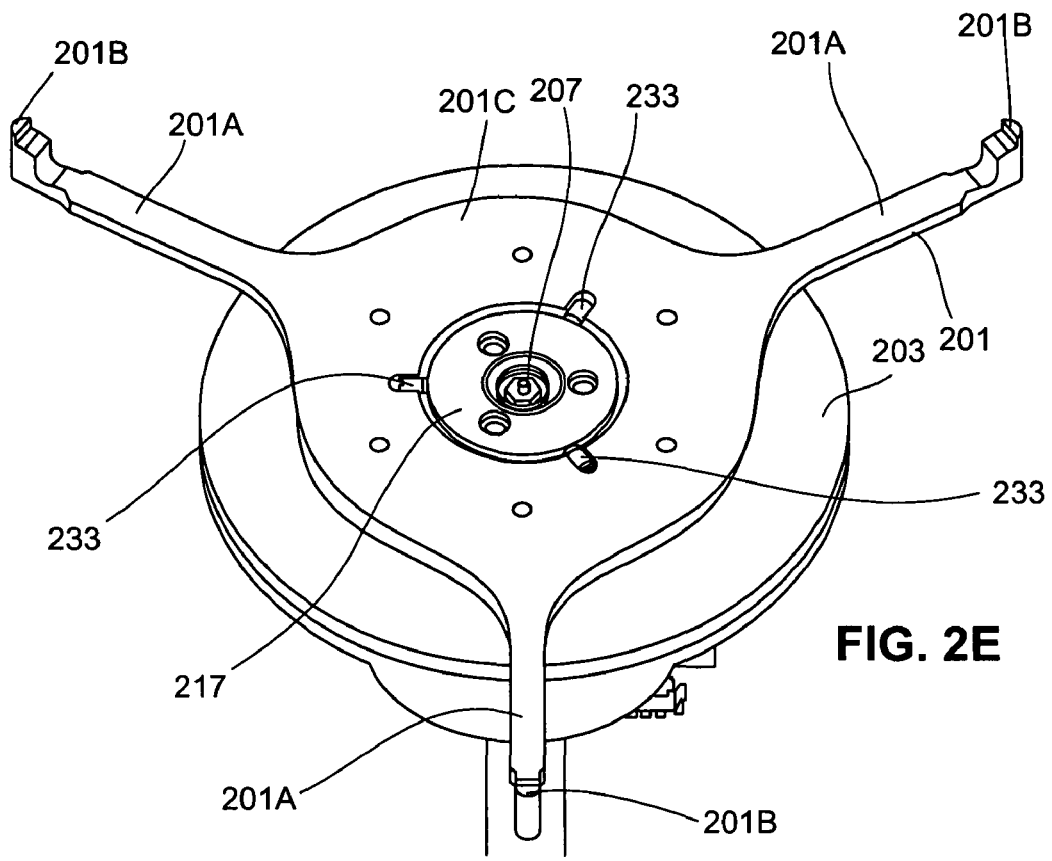
FIGS. 2E-2F are illustrations showing a partially assembled tactile lifter with the top surface of the wafer support member hub and top surface of the lock plate exposed, in accordance with one embodiment of the present invention.
Figure 2F:
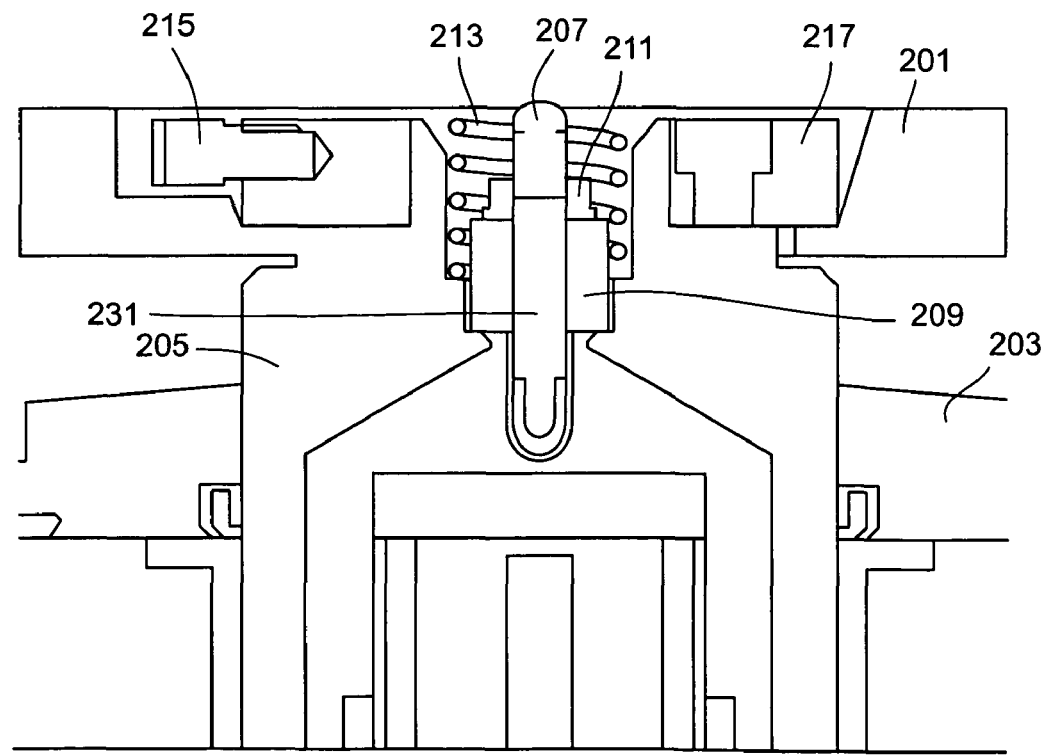

FIGS. 2E-2F are illustrations showing a partially assembled tactile lifter 200 with the top surface of the wafer support member hub 201C and top surface of the lock plate 217 exposed, in accordance with one embodiment of the present invention. As shown in FIG. 2E, the channels 233 are defined to receive the lock pins 215 which protrude radially outward from the outer side wall of the lock plate 217, as shown in FIG. 2F. The lock pin 215 and corresponding channel 233 are defined to prevent substantial rotation of the wafer support member 201 about the lock plate 217. The embodiment of FIGS. 2E-2F shows use of three lock pins 215 and corresponding channels 233 at radially equidistant locations about the lock plate 217 periphery. However, it should be understood that a different number of lock pins 215 and corresponding channels 233 can be utilized in other embodiments.

The tactile lifter 200 further includes a tactile switch 207 disposed within the center open region of the lock plate 217. The tactile switch 207 is secured within a tactile switch lock nut 211, such that a trigger end of the tactile switch 207 is oriented upward. The tactile switch 207 is defined as a normally closed switch that, upon being depressed to an activation point, opens to interrupt a circuit connected thereto. As discussed below, a number of components are attached to the wafer support member 201, such that downward movement of the wafer support member 201, e.g., by way of a collision, will cause the tactile switch 207 to be depressed. The tactile switch 207 is connected to the vertical drive system so as to immediately and automatically interrupt upward movement of the pedestal 205 and wafer support member 201 upon activation of the tactile switch 207.

Figure 4:
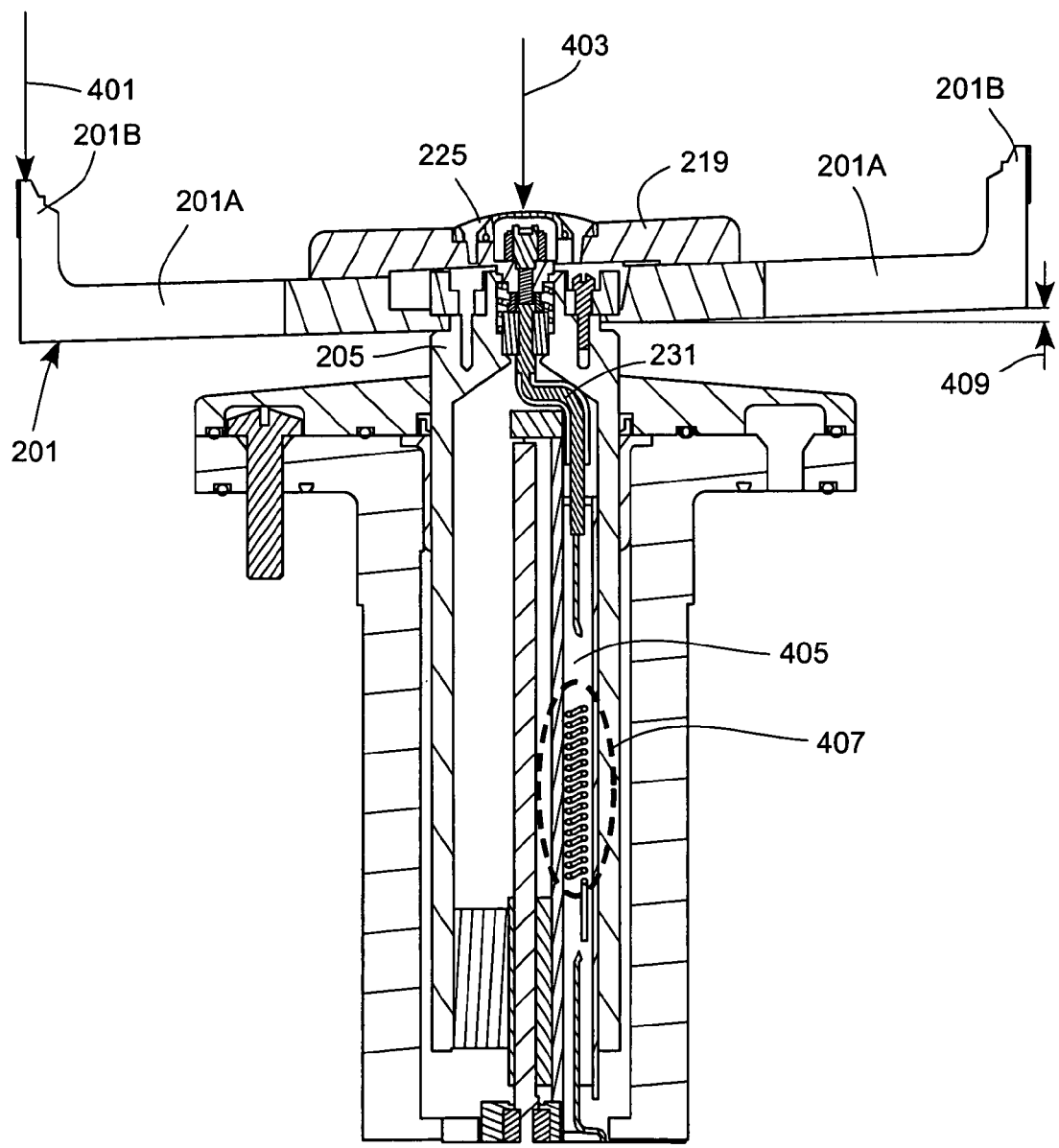
FIG. 4 is an illustration showing a cross-sectional view of the tactile lifter that depicts the coiled cable extending through the pedestal, in accordance with one embodiment of the present invention.

A coiled cable 231 is provided to electrically connect the tactile switch 207 to the vertical drive system, i.e., to the motor control of the vertical drive system. FIG. 4 is an illustration showing a cross-sectional view of the tactile lifter 200 that depicts the coiled cable 231 extending through the pedestal 205, in accordance with one embodiment of the present invention. In one embodiment, the coiled cable 231 is defined to include a pair of electrically conductive wires in electrical connection with the tactile switch 207. In one embodiment, each of the pair of electrically conductive wires within the coiled cable 231 is respectively coated with an electrically insulating material. The pair of electrically conductive wires is disposed within a jacket of elastic material. The jacket includes a coiled portion 407 to provide for extension and retraction of the coiled cable 231 as the wafer support member 201 is raised and lowered by way of the pedestal 205.

In one embodiment, the coiled cable 231 is defined by a pair of conductive wires (e.g., 38 gauge conductive wires) that are each coated with Teflon. Also in this embodiment, the pair of Teflon coated conductive wires is disposed within a polyurethane jacket. The polyurethane jacket forms and maintains the coiled portion 407 of the coiled cable 231. In one embodiment, the coiled cable 231 is disposed within a sleeve 405 defined within the pedestal 205. The sleeve 405 provides for smooth travel of the coiled cable 231 as it is extended and retracted within the pedestal 205. In one embodiment, the wafer support member 201 is capable of traveling over a vertical range of about 100 mm. Therefore, in this embodiment, the coiled cable 231 is defined to provide for extension and retraction over at least a 100 mm distance.

The tactile lifter 200 also includes a threaded adapter 209 defined to allow for transition from a larger feedthrough hole within pedestal 205 to a smaller hole associated with tactile switch lock nut 211. The larger feedthrough hole within the pedestal 205 facilitates assembly of the tactile wafer lifter 200. Specifically, the larger feedthrough hole within the pedestal 205 allows for insertion of the coiled cable 231 through the top of the pedestal 205, as opposed to threading the coiled cable 231 up through the bottom of the pedestal 205.

An elastically compliant member 213 is disposed between the wafer support member 201 and the pedestal 205. Also, a cover plate 219 is secured to a top surface of the wafer support member 201. A seal 227 is disposed between the cover plate 219 and the top surface of the wafer support member hub 201C. The seal 227 is defined to prevent intrusion of wafer processing materials, e.g., fluids, chemicals, by-products, etc., into the tactile switch 207 region. The cover plate 219 is defined to resist an upward force exerted thereon by the elastically compliant member 213. Therefore, the cover plate 219 and wafer support member 201 are secured together such that a force exerted on the wafer support member 201 is transferred through the cover plate 219 to the elastically compliant member 213, vice-versa.

More specifically, the elastically compliant member 213 is defined to provide upward force on wafer support member 201, by way of the cover plate 219 which is secured to the wafer support member 201. The upward force exerted by the elastically compliant member 213 maintains the wafer support member 201 in an upwardly disposed position relative to tactile switch 207 during normal conditions, i.e., in the absence of an abnormal downward force on the wafer support member 201. The normal upwardly disposed position of the wafer support member 201 corresponds to contact between the wafer support member 201 and the lock plate 217 at the interface 210. Additionally, the elastically compliant member 213 force, i.e., spring constant, is defined to provide a resultant force that is sufficient enough to prevent tripping of the tactile switch 207 as a result of upward acceleration of the pedestal 205, but low enough to allow for compression and tripping of the tactile switch 207 in the event of a collision between the wafer support member 201 and an interfering object.

The elastically compliant member 213 is defined to act in a spring-like manner when a sufficient downward force applied to the wafer support member 201. Compression of the elastically compliant member 213, due to downward force applied to wafer support member 201, allows for corresponding depression and activation of the tactile switch 207. The elastically compliant member 213 force is set such that the wafer support member 201 will move downward upon contact with an interfering object within the travel path of the wafer support member 201, and thereby activate the tactile switch 207. Also, the elastically compliant member 213 force is set to allow for downward movement of the wafer support member 201 before a breakage force is exerted on either the wafer support member 201 or interfering object.

In various embodiments, the elastically compliant member 213 can be essentially any type of elastically compliant member that provides adequate spring characteristics. For example, in one embodiment, the elastically compliant member 213 is a coiled spring. In another embodiment, the elastically compliant member 213 is defined by multiple coiled springs. In another embodiment, the elastically compliant member 213 is defined by an annular-shaped rubber component. In yet another embodiment, the elastically compliant member 213 is defined by a stack of annular-shaped rubber components that together provide adequate spring characteristics.

It should be appreciated that a required spring constant of the elastically compliant member 213 is defined based on a force required to break the wafer support member 201 or potential interfering object. In one embodiment, a silicon carbide wafer carrier, such as wafer carrier 101, represents the potentially interfering object. In one variation of this embodiment, the elastically compliant member 213 is defined by a spring constant within a range extending from about 20 to about 60 pounds per inch. In another variation of this embodiment, the elastically compliant member 213 is defined by a spring constant within a range extending from about 30 to about 50 pounds per inch.

The tactile lifter 200 also includes an adjustment screw 221 defined to engage with the cover plate 219 at a position above the tactile switch 207. The adjustment screw 221 is defined to depress the tactile switch 207 when a sufficient downward force is exerted upon the wafer support member 201, and is transferred through the cover plate 219 to the adjustment screw 221. The tactile lifter 200 further includes an adjustment lock nut 223 to prevent unwanted rotation of the adjustment screw 221. Additionally, an adjustment screw cover 225 and seal 229 are provided to protect the adjustment screw from exposure to wafer processing materials, e.g., fluids, chemicals, by-products, etc.

A vertical position of the adjustment screw 221 relative to the cover plate 219 controls an amount of vertical travel of the adjustment screw 221 required to depress the tactile switch 207 to its activation point. More specifically, the adjustment screw 221 allows for adjustment of a gap 208 between the adjustment screw 221 and the tactile switch 207. Adjustment of the gap 208 provides for adjustment of how much downward movement of wafer support member 201 is required for tactile switch 207 activation, i.e., provides for adjustment of tactile lifter 200 sensitivity. In one embodiment, the adjustment screw 221 is set to just contact the tactile switch 207, such that the gap 208 is set to essentially zero. In another embodiment, the gap 208 is set such that a vertical distance between the top of the tactile switch 207 and the adjustment screw 221 is within a range extending from about 0.01 inch to about 0.015 inch. In yet another embodiment, the gap 208 can be negative such that the adjustment screw 221 actually depresses the tactile switch 207 to a position within its dead band, i.e., to a position that does not yet reach the activation point of the tactile switch 207.

Figure 3A:
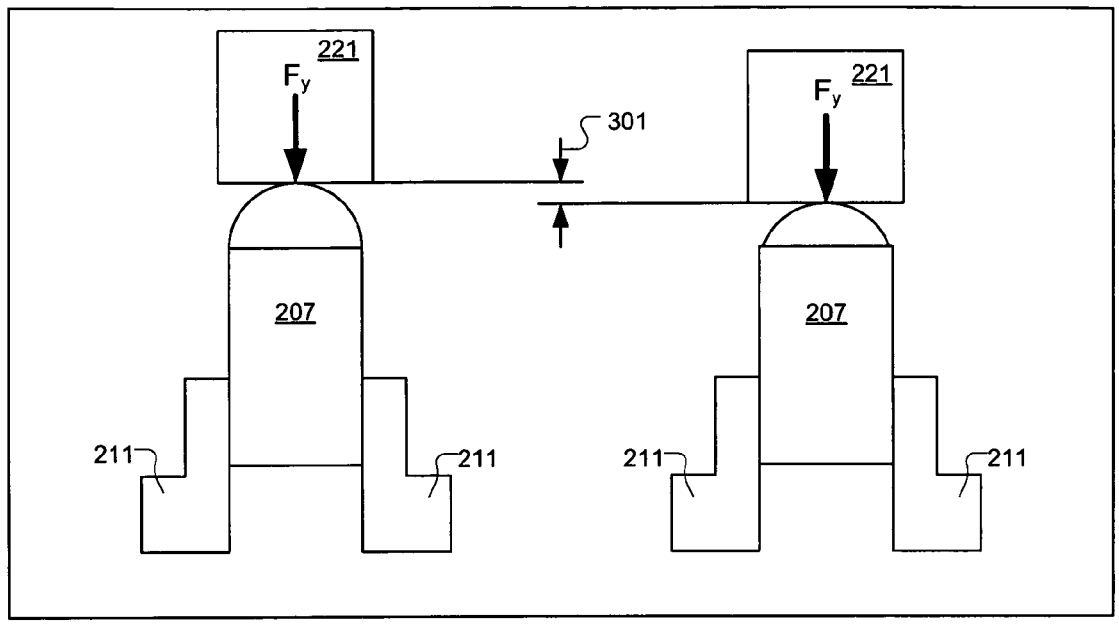
FIGS. 3A-3B illustrate operation of the tactile switch, in accordance with one embodiment of the present invention.
Figure 3B:
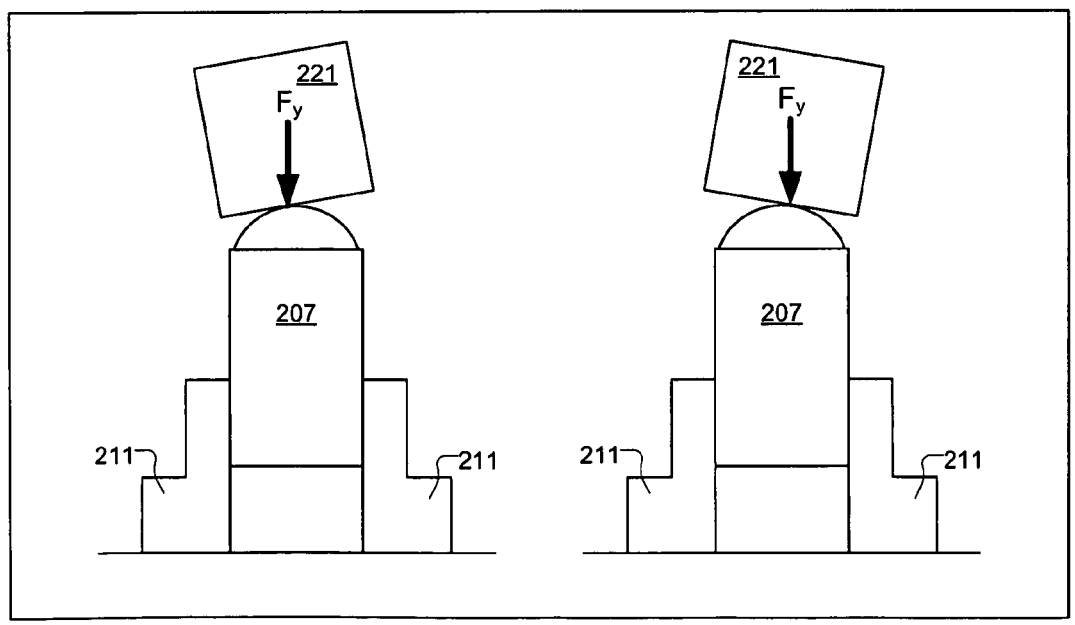

FIGS. 3A-3B illustrate operation of the tactile switch 207, in accordance with one embodiment of the present invention. The tactile switch 207 is defined to have a hemispherical-shaped trigger end, such that pressure at any point of the hemispherical-shaped trigger end will cause the tactile switch 207 to move downward toward its activation point. Therefore, a downward force exerted on either of the wafer engagement members 201B will cause the trigger end of the tactile switch 207 to be depressed. The tactile switch 207 may have an amount of dead band travel from its fully extended position to its activation point, as indicated by arrow 301. The tactile switch 207 is activated when depressed through its dead band to its activation point.

In one embodiment, the tactile lifter 200 is defined such that a gap 204 between the pedestal 205 and the wafer support member 201 defines an allowable downward movement range of the wafer support member 201 relative to the pedestal 205. The gap 204 is set sufficiently large to allow for enough downward movement of wafer support member 201 relative to pedestal 205, such that the tactile switch 207 will be depressed to its activation point prior to the wafer support member 201 reaching the pedestal 205.

In one exemplary embodiment, for a wafer support member 201 defined to accommodate a 300 mm wafer, a vertical height of gap 204 is set within a range extending from about 0.02 inch to about 0.06 inch. In another exemplary embodiment, for a wafer support member 201 defined to accommodate a 300 mm wafer, a vertical height of gap 204 is set at about 0.04 inch. Also, in one exemplary embodiment, for a wafer support member 201 defined to accommodate a 200 mm wafer, a vertical height of gap 204 is set within a range extending from about 0.01 inch to about 0.05 inch. In another exemplary embodiment, for a wafer support member 201 defined to accommodate a 200 mm wafer, a vertical height of gap 204 is set at about 0.03 inch.

The tactile lifter 200 is further defined such that a gap 206 exists between the lock plate 217 and the cover plate 219, when the wafer support member 201 is pushed upward to stop against the lock plate 217 at the interface 210. The gap 206 has a larger vertical height than the gap 204. Therefore, downward movement of the wafer support member 201 relative to the lock plate 217 will stop prior to contact between the lock plate 217 and cover plate 219.

As previously mentioned, FIG. 4 shows a cross-sectional view of the tactile lifter 200, in accordance with one embodiment of the present invention. As the wafer support member 201 is moved vertically upward by way of pedestal 205 upward movement, essentially any portion of the wafer support member 201, cover plate 219, or adjustment screw cover 225 may contact an interfering object, thereby causing downward movement of the wafer support member 201 to activate the tactile switch 207. In one embodiment, the tactile lifter 200 is defined such that a downward force of at least 0.5 pounds exerted on either of the wafer engagement members 201B, as indicated by arrow 401, is sufficient to activate the tactile switch 207. Such a downward force on either of the wafer engagement members 201B may cause the wafer support member 201 to tilt relative to the pedestal 205, as indicated by arrow 409. Such tilting of the wafer support member 201 is enabled by the elastically compliant member 213. Also, in one embodiment, the tactile lifter 200 is defined such that a downward force of at least 1.8 pounds exerted at the adjustment screw cover 225, as indicated by arrow 403, is sufficient to activate the tactile switch 207. It should be understood, however, that in other embodiments the spring characteristics of the elastically compliant member 213 can be set such that the wafer support member 201 is moveable to cause activation of the tactile switch 207 under different force magnitudes than those mentioned above.

Figure 5:
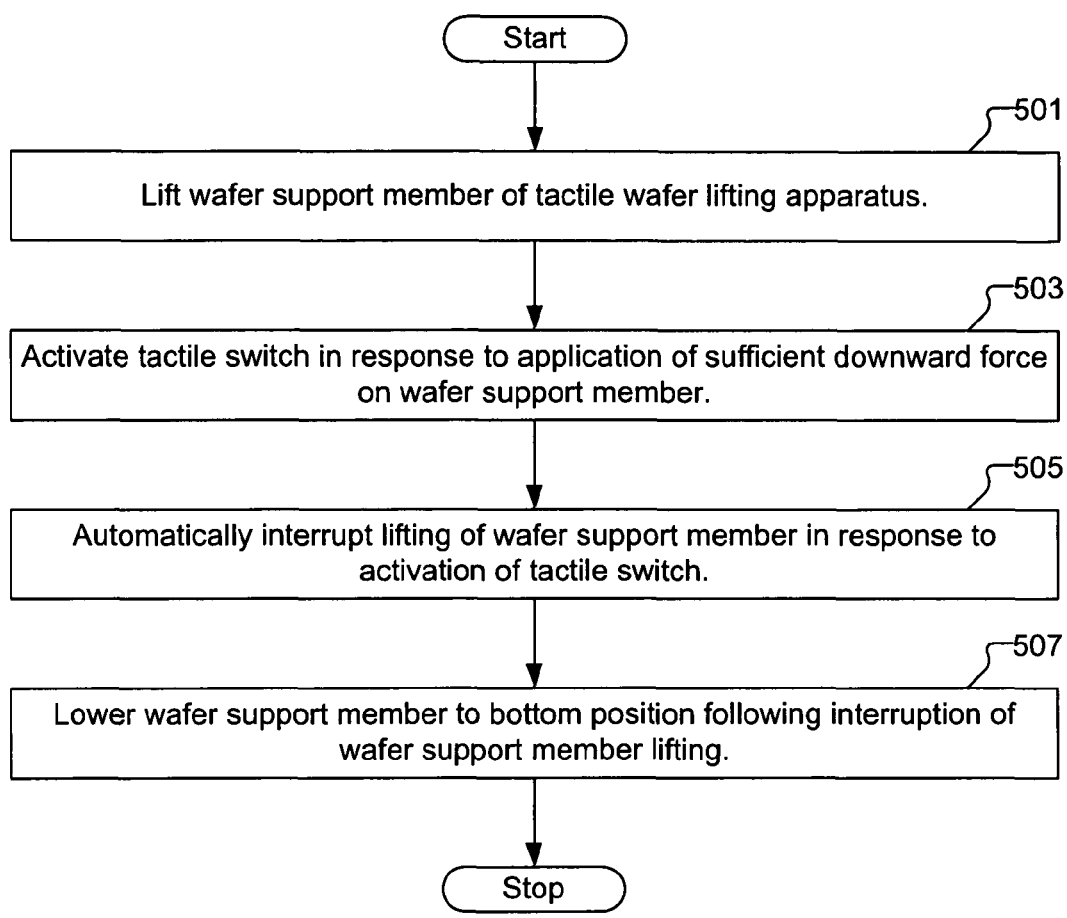
FIG. 5 shows a flowchart of a method for operating a tactile wafer lifting apparatus, in accordance with one embodiment of the present invention.

FIG. 5 shows a flowchart of a method for operating a tactile wafer lifting apparatus (tactile lifter 200), in accordance with one embodiment of the present invention. The method includes an operation 501 for lifting a wafer support member 201 of the tactile lifter 200. The method also includes an operation 503 for activating a tactile switch 207 in response to application of a sufficient downward force on the wafer support member 201. The tactile switch 207 is a normally closed switch. Application of the sufficient downward force on the wafer support member 201 causes the tactile switch 207 to be depressed to its activation point at which the tactile switch 207 opens to break an electrical circuit used to control lifting of the wafer support member 201. In one embodiment, the sufficient downward force required to activate the tactile switch 207 is within a range extending from about 0.5 pounds to about 2 pounds.

In response to activating the tactile switch 207, the method includes an operation 505 for automatically interrupting the lifting of the wafer support member 201. In one embodiment, momentum of the tactile lifter 200 motor may result in continued travel of the wafer support member 201 over a distance extending from about 3 mm to about 4 mm after cutoff of the tactile lifter 200 motor. The wafer support member 201 is sufficiently compliant so as to prevent component breakage over the continued travel distance of the wafer support member 201 following cutoff of the tactile lifter 200 motor. Also, the tactile lifter 200 is tuned to stop the upward movement of the wafer support member 201 upon activation of the tactile switch 207, and prior to plunging on the hard stop of the tactile switch 207 itself, thereby preventing damage to the tactile switch 207.

Following interruption of the wafer support lifting, the method includes an operation 507 for lowering the wafer support member 201 to a bottom position, i.e., to a home position. The method may also include an operation for setting a sensitivity of the tactile lifter 200 such that the tactile switch 207 activates prior to breakage of either the wafer support member 201 or a structure contacted by the wafer support member 201.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A tactile wafer lifting apparatus, comprising:
a pedestal;
a vertical drive connected to the pedestal, the vertical drive defined to provide controlled upward and downward movement of the pedestal;
a wafer support member disposed over the pedestal; and
a tactile switch disposed between the wafer support member and the pedestal such that sufficient downward force on the wafer support member causes activation of the tactile switch, wherein the tactile switch is connected to the vertical drive so as to interrupt upward movement of the pedestal and wafer support member disposed thereover upon activation of the tactile switch.

2. A tactile wafer lifting apparatus as recited in claim 1, wherein the wafer support member includes a central hub and a number of arms extending radially outward from the central hub, wherein each arm is terminated by a respective wafer engagement member defined to engage the wafer at a position above the central hub and the number of arms.

3. A tactile wafer lifting apparatus as recited in claim 1, further comprising:
an elastically compliant member disposed between the wafer support member and the pedestal such that a sufficient downward force applied to the wafer support member causes compression of the elastically compliant member and corresponding activation of the tactile switch.

4. A tactile wafer lifting apparatus as recited in claim 3, further comprising:
a cover plate secured to a top surface of the wafer support member, the cover plate defined to resist an upward force exerted thereon by the elastically compliant member, wherein the cover plate and wafer support member are secured together such that a force exerted on the wafer support member is transferred through the cover plate to the elastically compliant member, vice-versa.

5. A tactile wafer lifting apparatus as recited in claim 4, further comprising:
an adjustment screw defined to engage with the cover plate at a position above the tactile switch, the adjustment screw defined to depress the tactile switch when a sufficient downward force is exerted upon the wafer support member and is transferred through the cover plate to the adjustment screw, wherein a vertical setting of the adjustment screw controls an amount of vertical travel of the adjustment screw required to depress the tactile switch to its activation point.

6. A tactile wafer lifting apparatus as recited in claim 4, further comprising:
a lock plate secured to a top surface of the pedestal, wherein the lock plate is defined to provide a hard stop to upward movement of the wafer support member as the wafer support member is pushed upward by the force exerted on the wafer support member from the elastically compliant member through the cover plate.

7. A tactile wafer lifting apparatus as recited in claim 6, wherein the lock plate includes a pin secured within an outer peripheral side of the lock plate, and wherein the wafer support member includes a channel defined to receive the pin, wherein the pin and channel are defined to prevent substantial rotation of the wafer support member about the lock plate.

8. A tactile wafer lifting apparatus as recited in claim 1, further comprising:
a coiled cable defined to include a pair of electrically conductive wires in electrical connection with the tactile switch, wherein the coiled cable is disposed within a channel defined within the pedestal, wherein the coiled cable is defined to extend as the vertical drive is operated to move the pedestal upward and retract as the vertical drive is operated to move the pedestal downward.

9. A tactile wafer lifting apparatus as recited in claim 8, wherein each of the pair of electrically conductive wires is respectively coated with an electrically insulating material, and wherein the pair of electrically conductive wires is disposed within a jacket of elastic material, wherein the jacket includes a coiled portion to provide for extension and retraction of the coiled cable.

10. A tactile wafer lifting apparatus as recited in claim 1, wherein the tactile switch is defined as a normally closed switch that opens to interrupt an electrical circuit upon activation.

11. A wafer handling system, comprising:
a wafer carrier defined to move horizontally within a processing chamber, the wafer carrier including an open region having a number of wafer support tabs disposed about a periphery of the open region, wherein the open region is sized to accommodate a wafer when positioned on the wafer support tabs; and
a tactile wafer lifter disposed in a fixed position within the chamber below a horizontal traversal path of the wafer carrier, the tactile wafer lifter including,
a pedestal,
a wafer support member disposed over the pedestal,
a vertical drive connected to the pedestal, the vertical drive defined to provide controlled upward and downward movement of the pedestal and wafer support member disposed thereover such that the pedestal and wafer support member are moveable through the open region of the wafer carrier when the wafer carrier is positioned above the tactile wafer lifter, and
a tactile switch disposed between the wafer support member and the pedestal such that sufficient downward force on the wafer support member causes activation of the tactile switch, wherein the tactile switch is connected to the vertical drive so as to interrupt upward movement of the pedestal and wafer support member disposed thereover upon activation of the tactile switch.

12. A wafer handling system as recited in claim 11, wherein the wafer support member includes a central hub and a number of arms extending radially outward from the central hub, wherein each arm is terminated by a respective wafer engagement member defined to engage the wafer at a position above the central hub and the number of arms.

13. A wafer handling system as recited in claim 11, further comprising:
an elastically compliant member disposed between the wafer support member and the pedestal such that a sufficient downward force applied to the wafer support member causes compression of the elastically compliant member and corresponding activation of the tactile switch.

14. A wafer handling system as recited in claim 13, further comprising:
a cover plate secured to a top surface of the wafer support member, the cover plate defined to resist an upward force exerted thereon by the elastically compliant member, wherein the cover plate and wafer support member are secured together such that a force exerted on the wafer support member is transferred through the cover plate to the elastically compliant member, vice-versa.

15. A wafer handling system as recited in claim 14, further comprising:
an adjustment screw defined to engage with the cover plate at a position above the tactile switch, the adjustment screw defined to depress the tactile switch when a sufficient downward force is exerted upon the wafer support member and is transferred through the cover plate to the adjustment screw, wherein a vertical setting of the adjustment screw controls an amount of vertical travel of the adjustment screw required to depress the tactile switch to its activation point.

16. A wafer handling system as recited in claim 14, further comprising:
a lock plate secured to a top surface of the pedestal, wherein the lock plate is defined to provide a hard stop to upward movement of the wafer support member as the wafer support member is pushed upward by the force exerted on the wafer support member from the elastically compliant member through the cover plate.

17. A wafer handling system as recited in claim 16, wherein the lock plate includes a pin secured within an outer peripheral side of the lock plate, and wherein the wafer support member includes a channel defined to receive the pin, wherein the pin and channel are defined to prevent substantial rotation of the wafer support member about the lock plate.

18. A wafer handling system as recited in claim 11, wherein the tactile switch is defined as a normally closed switch that opens to interrupt an electrical circuit upon activation.

* * * * *